United States Patent [19]

Matsuda

[11] Patent Number: 5,151,554
[45] Date of Patent: Sep. 29, 1992

[54] HIGH SPEED SWITCH SCANNING APPARATUS

[75] Inventor: Takashi Matsuda, Ome, Japan

[73] Assignee: Casio Computer Co., Ltd., Tokyo, Japan

[21] Appl. No.: 510,966

[22] Filed: Apr. 19, 1990

[30] Foreign Application Priority Data

Apr. 27, 1989 [JP] Japan .................................. 1-105825

[51] Int. Cl.$^5$ .......................... G10H 1/00; G08C 9/00
[52] U.S. Cl. ......................................... 84/655; 84/617;
    84/658; 84/DIG. 7; 340/825.1; 340/825.79
[58] Field of Search .................. 84/DIG. 23, 617, 626,
    84/655, 658, 682, 687, DIG. 7; 340/825.1,
    825.11, 825.12, 825.13, 825.79

[56] References Cited

U.S. PATENT DOCUMENTS

| Re. 32,069 | 1/1986 | Tomisawa ..................... 84/617 |
| 4,080,863 | 3/1978 | Groeschel ..................... 84/658 |
| 4,362,934 | 12/1982 | McLey ........................... 84/658 |
| 4,620,469 | 11/1986 | Deutsch et al. ............... 84/658 |
| 4,699,038 | 10/1987 | Wedge ........................... 84/658 |
| 4,974,486 | 12/1990 | Wallace ........................ 84/609 |
| 5,003,859 | 4/1991 | Monte et al. ................. 84/423 R |

Primary Examiner—William M. Shoop, Jr.
Assistant Examiner—Helen Kim
Attorney, Agent, or Firm—Frishauf, Holtz, Goodman & Woodward

[57] ABSTRACT

A key matrix scanning apparatus is provided. The key matrix comprises a plurality of switches which are arranged at intersections of a plurality of input signal lines and a plurality of output signal lines. The scanning apparatus repeatedly and quickly discharges or charges the plurality of input signal lines at appropriate times within a one complete scanning cycle to establish a reference potential on these lines in preparation for readings of switch states. Therefore, the scanning apparatus can provide a high-speed scanning of switches with high reliability. A good number of switches can be coupled to be read by a single unit of key scanner without a substantial delay in the detection of the switch operation.

17 Claims, 11 Drawing Sheets

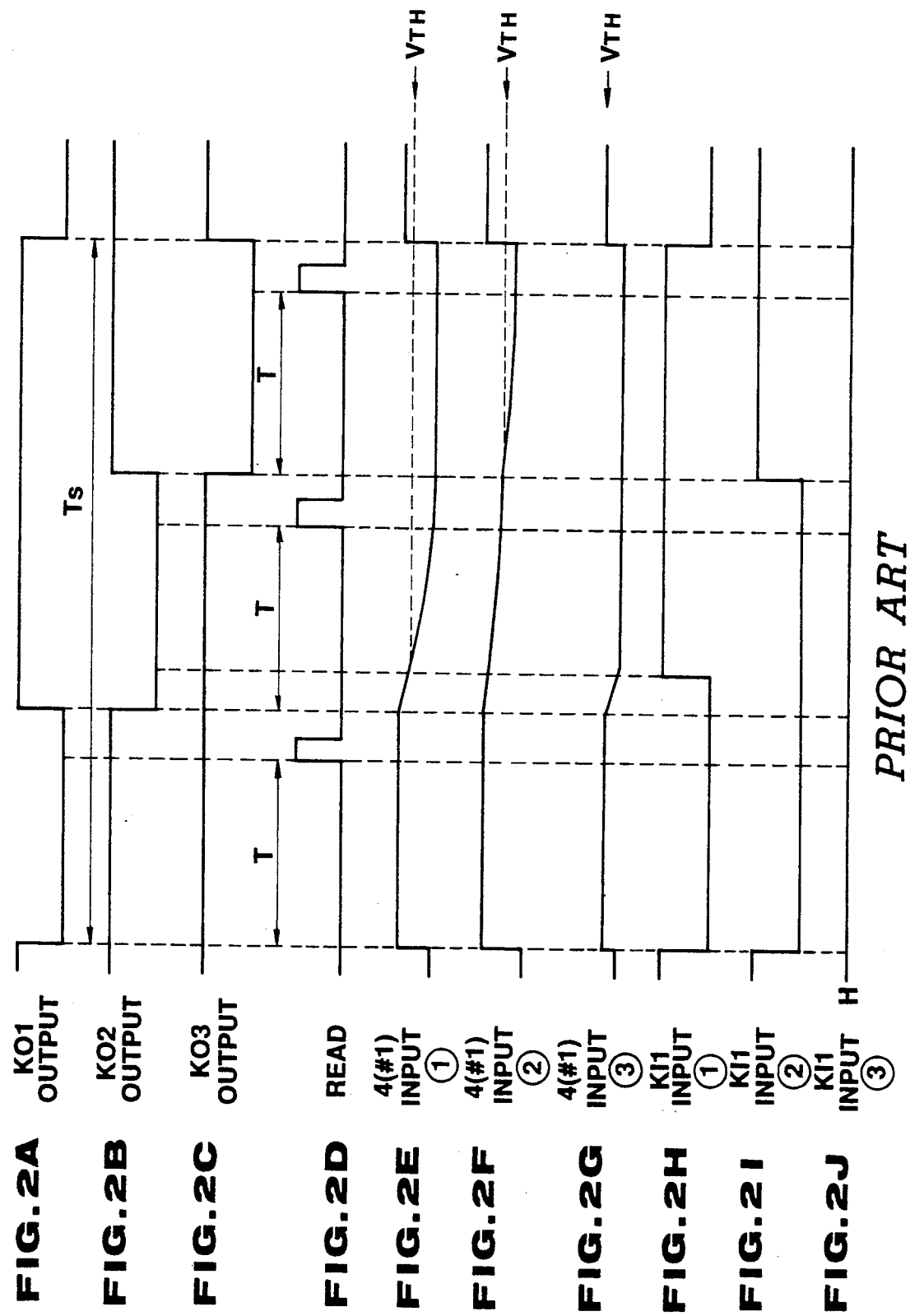

*PRIOR ART*

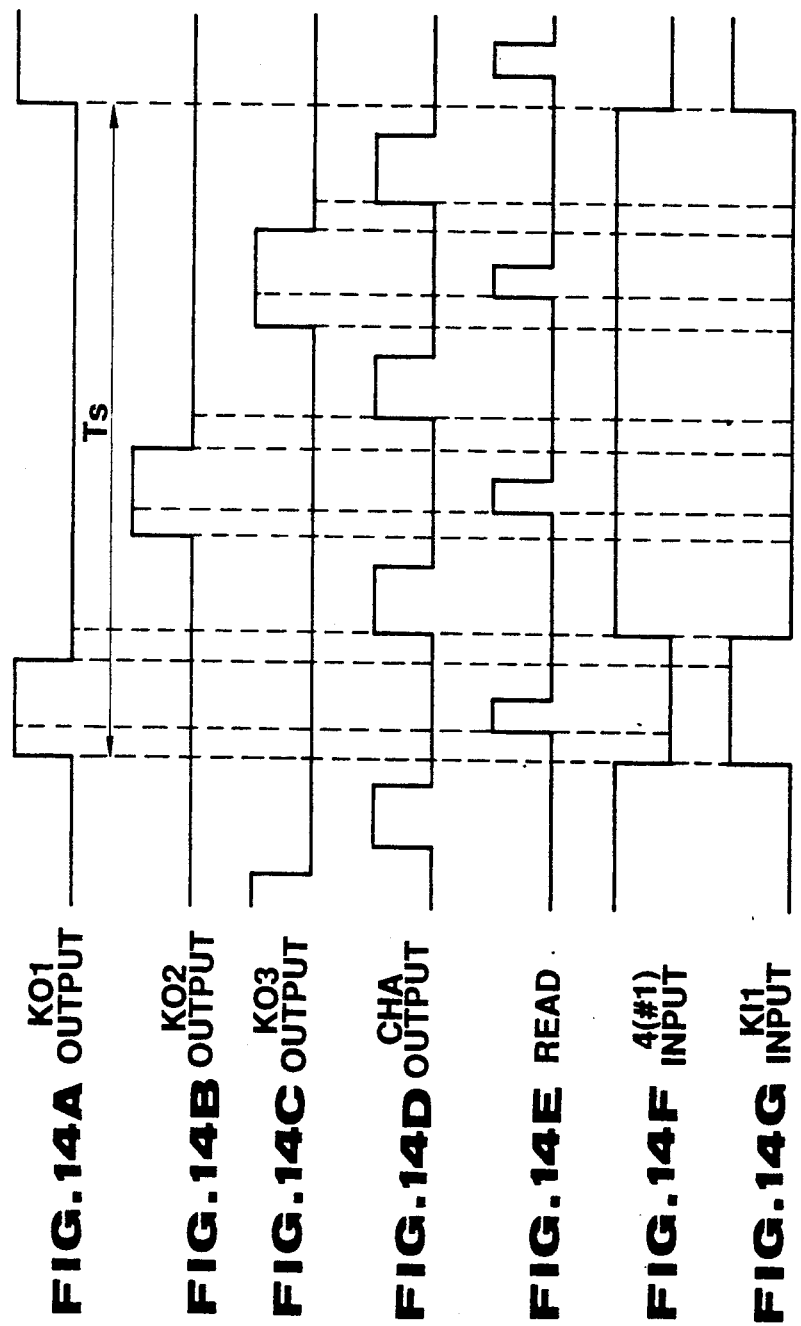

HIGH SPEED SWITCH SCANNING APPARATUS

BACKGROUND OF THE INVENTION

1. Field of the Invention

The present invention relates to an apparatus which detects on/off status of switches arranged in a matrix style at respective intersections of input signal lines and output signal lines.

2. Description of the Related Art

In various types of electronic equipment for detecting operations of a plurality of key switches, it is desired to minimize the number of total signal lines that are connected to such key switches for the purpose of miniaturizing the equipment and simplifying key operation detection.

To this end a conventional system called a key matrix system is known in which a plurality of keys are arranged in a matrix at respective intersections of signal input and output lines such that the signal output lines form common inputs to all switches and the signal input lines provide common or time division multiplexed (TDM) outputs from all switches.

FIG. 1 shows a first prior art arrangement of the key matrix system in which a 3×3 array of key switches 1#(1) to 1#(9) are connected to form a key matrix circuit. Output terminals KO1 to KO3 of CPU7 are connected to respective inverters 3(#1) to 3(#3), which also functions as drivers. The inverters (drivers) 3(#1) to 3(#3) are connected to output signal lines 11 to 13 respectively. Three input signal lines m1 to m3 cross each of the output signal lines. At three intersections of the first output signal line 11 and the input signal lines m1 to m3, there are formed diodes 2(#1), 2(#4) and 2(#7) with their anodes being coupled to the output signal line 11. Cathode sides of the diodes are connected to first terminals of key switches 1(#1), 1(#4) and 1(#7) respectively. Second terminals of the key switches 1(#1), 1(#4) and 1(#7) are connected to the input signal lines m1 to m3 respectively. Similarly, three intersections of the second output signal line 12 and the input signal lines m1 to m3 are formed by diodes 2(#2), 2(#5) and 2(#8) with their anodes coupled to the second output signal line, and with their cathodes respectively connected to first terminals of key switches 1(#2), 1(#5) and 1(#8). Second terminals of the key switches 1(#2), 1(#5) and 1(#8) are connected to the input signal lines m1 to m3 respectively. Similarly, at three intersections of the third output signal line 13 and the input signal lines m1 to m3, the output signal lines 13 is connected to each anode side of diodes 2(#3), 2(#6) and 2(#9). Cathode sides of the diodes 2(#3), 2(#6) and 2(#9) are connected to first terminals of key switches 1(#3), 1(#6) and 1(#9) respectively. Second terminals of the key switches 1(#3), 1(#6) and 1(#9) are connected to the input signal lines m1 to m3 respectively.

The input signal lines m1 to m3 are connected to inverters 4(#1) to 4(#3) which also function as recliners. Each output of the inverters (receivers) is supplied to respective input terminals KI1 to KI3 of CPU7. Each inverter (receiver) 4(#1) to 4(#3) outputs a high level ("1") voltage when voltage of the input signal lines m1 to m3 is below a threshold level $V_{TH}$, and is switched to a low level ("0") voltage when the voltage of the input signal lines exceeds the threshold level $V_{TH}$.

There are shown capacitors 6(#1) to 6(#3) which couple the respective signal input lines m1 to m3 to ground. The line-ground capacitors 6(#1) to 6(#3) represent the respective capacitance of the input signal lines and also capacitors which may be actually inserted for noise elimination.

Resistors 5(#1) to 5(#3) termed pull-down resistors all have the same resistance $R_1$ and are arranged to couple respective input signal lines to ground in parallel to the respective capacitors 6(#1) to 6(#3).

CPU7 outputs patterned control voltage signals (to be described later) to output terminals (ports) KO1 to KO3, and detects status, of key switches 1(#1) to (#9) from voltages which appear terminals KI1 to KI3.

An equivalent circuit of each key switch 1(#1) to 1(#9) in FIG. 1 is shown in FIGS. 3A and 3B. FIG. 3A shows an ideal one. In fact, however, there is a line resistance r including a contact resistance of the switch between terminals A and B, as shown in FIG. 3B. The value of the resistance r depends on the type of the key switch, used and an inexpensive key switch typically has a relatively large value of contact resistance.

In some applications, the output signal lines 11 to 13 and input signal lines m1 to m3 arranged on a print circuit board (not shown in FIG. 1) may have a large resistance of their own. Therefore, resistance r shown in FIG. 3B includes such resistances also.

FIGS. 2A to 2J show a time chart of operations of the first prior art arrangement in FIG. 1. Under the control of CPU7, the output terminals KO1 to KO3 supply voltage pulses as shown in FIGS. 2A to 2C in such a manner that the terminals KO1 to KO3 are set to a low level successively and cyclically.

READ pulses shown in FIG. 2D represent times at which CUP7 reads input signals which appear input on terminals KI1 to KI3. Each READ pulse occurs at a predetermined time T after a low-going edge of the outputs KO1 to, KO3 so that CPU7, reads switches 2(#1), 2(#4) and 2(#7) with KO1="low", reads switches 2(#2), 2(#5) and 2(#8) with KO2="low" and reads switches 2(#3), 2(#6) and 2(#9) with KO3="low" by receiving TDM input voltages which appear on KI1 to KI3 at respective READ pulse times.

Let us discuss a case where only the key switch 1(#1) is ON-actuated.

FIG. 4 shows an equivalent circuit involving the on-state key switch 1(#1) with KO1="Low" in which $R_0$ denotes an "on" output impedance of (a pull-up transistor, not shown, of) the (driver) inverter 3(#1), $V_{DD}$ denotes a power source (positive) voltage coupled to the inverter (driver) 3(#1), r represents an on-resistance of key switch 1(#1) (refer to FIG. 3B), and $R_1$ corresponds to a value of the pull-down resistor 5(#1) in FIG. 1. The receiver inverter 4(#1) is assumed to have a sufficiently large input impedance.

With the switch 1(#1)="ON", and KO1="LOW", an input voltage to the receiver inverter 4(#1) is obtained by dividing $V_{DD}$ less $V_F$ (forward bias of the diode 2(#1) by a factor determined by the voltage dividing circuit of $R_0$, r and $R_1$. Namely, the receiver input voltage is given by $$\frac{R_1(V_{DD} - V_F)}{R_0 + r + R_1} \quad \text{(Eq. (1))}$$

FIGS. 2E to 2G show inputs to receiver inverter 4(#1), and FIGS. 2H to 2J show inputs to a terminal KI1 of CPU7. Of these figures, FIGS. 2E and 2H represent a case ① where a ratio of $R_0+r$ to $R_1$ appeared in equation (1) is correctly set, FIGS. 2F and 2I represent a case ② when $R_1$ is relatively too large, and FIGS. 2G and 2J represent a case ③ when $R_1$ is too small.

More specifically, during the low level output KO1 period, in both cases of ① and ②, an input voltage to the receiver inverter 4(#1) is sufficiently larger than the threshold voltage $V_{TH}$ as shown in FIGS. 2E and 2F so that the input voltage of the terminal KI1 assumes a correct level, indicative of "on-state" of the switch 1(#1) as shown in FIGS. 2H and 2I. On the contrary, in case ③ that uses a too small pull-down resistor $R_1$, an input voltage of the inverter 4(#1) is erroneously below the threshold voltage $V_{TH}$ as shown in FIG. 2G so that a high level input voltage appears on the input terminal KI1 and faultly indicates "off-state" of the key switch 1(#1) though that switch is in fact operated. Therefore, there is a lower limit to the pull-down resistance $R_1$ relative to the switch and driver resistances r and $R_0$ for reliable detection of "on-state" of key switches.

The worst situation occurs when a plurality of key switches 1(#1), 1(#4) and 1(#7) are simultaneously actuated ON. FIG. 5 shows a relationship of resistances in the worst case with KO1="LOW". Note that, impedances of inverters 4(#2) and 4(#3) are not shown because those are sufficiently large and their effect could be negligible. In this figure, $R_0$ denotes an ON-resistance of the driver inverter 3(#1), r's denote on-resistances of respective key switches 1(#1), 1(#4) and 1(#7), and three $R_1$'s represent resistances of respective pull-down resistors 5(#1) to 5(#3). In FIG. 5, a current flowing through driver resistor $R_0$ is three times the current flowing through respective pull-down resistors $R_1$'s.

Therefore, an input voltage of the receiver inverter 4(#1) assumes $$\frac{R_1(V_{DD} - V_F)}{3R_0 + r + R_1} \quad \text{(Eq. 2)}$$

As noted, influence of the driver on-impedance $R_0$ on the receiver input will become larger as a number of input signal lines increases. In general, for a number of the input signal lines n, the influence will be on the order of $n \times R_0$ in the case where all n key switches are actuated ON at the same time. Therefore, it is desired to use driver inverters 3(#1), 3(#2) and 3(#3) with a smaller value of on-impedance $R_0$ for reliable detection of simultaneous on-operations of a plurality of key switches.

However, from a manufacturing point there is a lower limit to the value $R_0$ because this is an on-resistance of a driver inverter that is one form of semiconductor device and typically fabricated as a CMOS inverter circuit, which may be formed in a large scaled integrated circuit (LSI) chip, generally accompanied by relatively high on-impedances. To compensate for this, the pull-down resistors can be made with a higher resistance $R_1$ relative to the driver resistance, but this involves another problem discussed below.

In FIGS. 2A to 2J, such a problematic situation occurs during the low level output KO2 period (FIG. 2B) with respect to the off-state key switch 1#(2) that is to be read next after reading the on-state key switch 1#(1). In order to correctly detect the off-state of the key switch 1(#2), an input voltage to the receiver inverter 4(#1) must be lowered below the threshold level VTH (FIG. 2E) at READ pulse time (FIG. 2D) during the low KO2 period. However, in case ②, involving a relatively high value of the pull-down resistor 5(#1), an input level to the receiver inverter 4(#1) is still larger than $V_{TH}$ as shown in FIG. 2F at the time of READ pulse so that a low level input voltage is provided to the CPU terminal KI1, causing CPU7 to misread that the key switch 1(#2) is also actuated ON.

This is due to an electric charge stored in capacitor 6(#1) shown in FIG. 1 having failed to discharge to a desired extent through the pull-down resistor during a setting or waiting time T, because the pull-down resistor value $R_1$ is too large.

The above-mentioned problem could be solved by making longer a period of time in which output voltages of KO1 to KO3 shown in FIGS. 2A to 2C are successively lowered and by lengthening a waiting time T to the READ pulse shown in FIG. 2D. However, if this is done then, one complete cycle Ts of detecting all key operations must also be longer, resulting in a slow response to key operations. Further, in a system which alternately executes a key operation detection (key scanning) with other processes, the speed of other processes is slowed down because of the time required for key scanning.

Especially, in a touch response featured electronic keyboard instrument that detects a key operation velocity by measuring an operation time difference between on-timings of two switches provided for each play key, it is important to provide an accurate time difference of switch-ON operations. If the above-mentioned prior art is applied to such an electronic keyboard instrument, this results in an undesirable system with slow and inaccurate touch response because of a considerable delay in detecting key operations.

Therefore, there is an upper limit to the value of the pull-down resistance $R_1$ in order to minimize the time required for detecting key operations. This does restrict a number of output signal lines in the key matrix circuit. Further, a number of input signal lines are also limited because of an increased adverse effect of the driver inverter on-impedance $R_0$ for simultaneous on-operations of an increased number of key switches, as discussed in conjunction with FIG. 5. For a given number of n×n key switches, a minimum and optimum number of signal lines are 2n, using n lines as input signal lines and also using n lines as output signal lines. However, if the number of n exceeds the limits of the prior art, there would be no other way but to subdivide the key switches into a plurality of, say, two groups such that a first group of key switches are connected to form a first key matrix circuit and a second group of key switches are connected to form a second and separate key matrix circuit. The first key matrix circuit is scanned by a first CPU or a key scanner hardware while the second key matrix circuit is scanned by a second CPU or a second key scanner hardware. The first and second key scanners provide key information to a (host) CPU. Such an arrangement, however, clearly adds complexity with an increased number of signal lines, separate key scanners, and complicated control of the entire system.

Next, a second prior art arrangement will be taken up.

This second prior art is constructed as shown in FIG. 6. As will be understood by comparing FIG. 6 with FIG. 1, the second prior art arrangement is operated in an opposite logic contrary to the first prior art arrangement.

More specifically, in the first prior art arrangement (refer to FIG. 1) CPU7 supplies output terminals KO1--

KO3 with active "low" level pulses successively and cyclically in the order of KO1, KO2, KO3, KO1 and so on, and receives voltage levels on input terminals KI1—KI3 each time when a waiting time T has passed from the beginning of each low voltage pulse output. CPU7 then detects an ON-status of of any key switches 1(#1) to 1(#9) from a "low" level voltage of KI1 to KI3. These operations are already described by referring to time charts shown in FIGS. 2A to 2J.

On the contrary, in the second prior art (refer to FIG. 6) CPU7, outputs "high" level pulses to and in the order of KO1, KO2, KO3, KO1 and so on as shown in FIGS. 7A to 7C. Further, similarly to the first prior art, arrangement CPU7 arrangement receives voltages which appear on the input terminals KI1 to KI3 each time when a settling time T has passed from the beginning of the high voltage pulse output as shown in FIG. 7D, and detects an ON-status of any of key switches 1(#1) to 1(#9) when a corresponding voltage level of KI1 to KI3 is "high".

The second prior art arrangement has the same problem as the first prior art arrangement.

Let us consider again an example in which only the key switch 1(#1) is actuated ON.

In this condition, there is formed an equivalent circuit associated with the on-state key switch 1(#1) during the active high level KO1 period, as shown in FIG. 8 in which $R_0$ denotes an on-impedance of (a pull-down transistor, not shown, of) the inverter driver 3(#1) in FIG. 6, $V_{DD}$ denotes power source positive voltage which is supplied to input signal lines m1 to m3 through pull-up resistors 5(#1) to 5(#3), resistance r represents that of key switch 1(#1) (refer to FIG. 3B), and resistance $R_1$ corresponds to that of the pull-up resistor 5(#1) Further, an input impedance of inverter (receiver) 4(#1) is assumed to be sufficiently large.

With key switch 1(#1)=ON, and KO1="HIGH", an input voltage to the inverter (receiver) 4(#1) is obtained from FIG. 8 by VF(forward bias of the diode 2(#1), plus (VDD-VF) divided by a factor determined by resistances $R_1$, r, $R_0$ Namely, the receiver input voltage is given by $$\frac{(R_0 + r)(V_{DD} - V_F)}{R_0 + r + R_1} \quad \text{(Eq. 3)}$$

FIGS. 7E to 7G show inputs to the inverter (receiver) 4(#1), and FIGS. 7H to 7J show inputs to the terminal KI1 of the CPU7. Of these figures, FIGS. 7E and 7H represent a case ①, where a ratio of $R_0+r$ to $R_1$ which appears in equation (3) is correctly set, FIGS. 7F and 7I represent a case ②, when the pull-up resistance $R_1$ is too large, and FIGS. 7G and 7J represent a case ③ when $R_1$ is too small.

More specifically, with output KO1="HIGH", both cases ① and ② see an input voltage to the inverter (receiver) 4(#1) smaller than the threshold voltage $V_{TH}$ as shown in FIGS. 7E and 7F so that a correct high level input voltage appears on the terminal KI1, indicative of an on-state of the key switch 1(#1), as shown in FIGS. 7H and 7I. On the contrary, in case ③ using a too small pull-up resistance, an input voltage to the inverter (driver) 4(#1) exceeds a threshold level $V_{TH}$ as shown in FIG. 7G, thus causing its output i.e., input voltage to the input terminal KI1 to assume a low level erroneously indicative of an off-state of the key switch 1(#1).

The worst status occurs when all key switches 1(#1), 1(#4) and 1(#7) are simultaneously actuated ON. FIG. 9 shows an equivalent circuit in the worst case with KO1="HIGH". Note that, impedances of inverters 4(#1) to 4(#3) are not shown because those are sufficiently large and their effect would be negligible. In this figure, $R_0$ denotes an ON-resistance of the driver inverter 3(#1), r's represents resistances of on-state key switches 1(#1), 1(#4) and 1(#7), and three $R_1$'s represent resistances of respective pull-up resistors 5(#1) to 5(#3).

In FIG. 9, a current flowing through driver resistance $R_0$ is three times the current flowing through individual pull up resistance $R_1$. Therefore, an input to the receiver inverter 4(#1) is given by $$\frac{(3R_0 + r)(V_{DD} - V_F)}{3R_0 + r + R_1} + V_F \quad \text{(Eq. 4)}$$

An influence of driver resistance $R_0$ on the receiver input voltage level will become larger as the number of input signal lines increases. More specifically, if the number of input signal lines increases to n lines (i.e., m1 to m3), the influence increases in an order of $n \times R_0$. Therefore, it is desired to use inverters (drivers) 3(#1) to 3(#3) having a smaller value of on-impedance $R_0$ with their input="HIGH" for reliable detection of simultaneous on-operations of a plural key switches.

However, as described in connection with arrangement the first prior art there is a lower limit to the value of the driver resistance $R_0$ for manufacturing reasons. Whereas this problem could be solved by enlarging the value of the pull-up resistor $R_1$ relative to the driver resistance $R_0$ to attain a desired ratio of $R_0$ to $R_1$, this approach raises another problem similar to the one discussed above in connection with the first prior art arrangement.

In FIGS. 7A to 7J, such a problematic situation occurs during the high active output KO2 level period when CPU7 attempts to read the off-state key switch 1(#2) after having read the on-state key switch 1(#1) during the immediately preceding period of KO1="HIGH". Namely, an input level to the inverter (receiver) 4(#1) must go beyond the threshold level $V_{TH}$ (FIG. 7E) at the second READ pulse in FIG. 7D that occurs a predetermined time T from the rising edge of the pulse KO2, because the key switch 1(#2) is in an OFF status. Nevertheless, in case ② using a relatively high pull-up resistance $R_1$, an input level to the inverter (receiver) (#1) is still smaller than $V_{TH}$ at the READ pulse time as shown in FIG. 7F, which causes its output i.e., input voltage to the terminal KI1, to assume a high level erroneously indicative of an on-state of the key switch 1(#2).

This is due to the capacitor 6(#1) (FIG. 6) having failed to sufficiently charge itself via $R_1$ during a settling time T because the pull-up resistance $R_1$ is too large.

The problem of misreading an off-state switch next to an on-state switch could be solved by lengthening a high level period on KO1 to KO3 as well as a waiting time T to a READ pulse in FIG. 7D. This obviously sacrifices a cycle time Ts required for a scanning of all the key switches. In summary, the first and second prior art arrangement can only use a key matrix circuit with a limited number of key switches to assure reliable key scanning within a limited time for detecting all key switches in the key matrix circuit.

SUMMARY OF THE INVENTION

It is, therefore, an object of the invention to provide a switch operation detection apparatus capable of scanning a greater number of key switches at higher speed. Another object of the invention is to provide a switch operation detection apparatus capable of using an optimal number of signal lines for connection to a good number of key switches thereby to attain a circuit miniaturization. Another object of the invention is to provide a system with a high speed key scanning function allowing improved efficiency of the execution of other processes.

In accordance with the invention, the objects are essentially achieved by adding to a switch operation detection apparatus of the type as described before, potential establishing means for quickly establishing a reference potential on input signal lines extending from a plurality of key switches at appropriate times before each voltage pulse is supplied to a different one of a plurality of output signal lines coupled to the plurality of key switches.

In accordance with one aspect of the present invention, there is provided a switch operation detection apparatus, which includes a plurality of switch means arranged in a switch matrix at intersections of a plurality of input signal lines and a plurality of output signal lines, each for selectively connecting a corresponding output signal line to a corresponding input signal line, scanning means for scanning the switch matrix by supplying a series of voltage pulses to the plurality of output signal lines one voltage pulse at a time to one of the plurality of output signal lines and by detecting voltage levels derived from the plurality of input signal lines in order to read respective ON/OFF status of the plurality of switch means, and discharging means for periodically and rapidly discharging an electric charge stored in the plurality of input signal lines at times prior to each of said voltage pulses being supplied to a different one of the plurality of output lines.

In accordance with another aspect of the present invention, there is provided a switch operation detection apparatus, which includes a plurality of switch means arranged in a switch matrix at intersections of a plurality of input signal lines and a plurality of output signal lines, for selectively connecting a corresponding output signal line to a corresponding input signal line electronically, scanning means for scanning the switch matrix by supplying a series of voltage pulses to the plurality of output signal lines one voltage pulse at a time to one of the plurality of output signal lines and by detecting voltage levels derived from the plurality of input signal lines in order to read respective ON/OFF status of the plurality of switch means, and charging means for periodically and rapidly charging the plurality of input signal lines at times prior to each of said voltage pulses being supplied to a different one of the plurality of output lines.

Namely, in a key matrix scanning apparatus operating in a positive logic (corresponding to a first embodiment of the present invention described later), an electric charge stored in an input signal line is forcibly discharged to quickly establish a reference potential on the input signal line before a key common signal is supplied to an output signal line, and in a key matrix scanning apparatus operating in a negative logic (corresponding to a second embodiment of the present invention described later), an electric charge is forcibly supplied to an input signal line to establish a reference potential on the input signal line before a key common signal is supplied to an output signal line. The reference potential is typically defined by a voltage level corresponding to an off-state of a key switch. As a result, a discharging operation or a charging operation on the input signal line, which was done in the prior art only by means of a resistor such as pull-up or pull-down resistor $R_1$ stated before, is assisted in accordance with the present invention, and therefore the problems of the prior art are essentially solved.

With the key matrix scanning apparatus of the invention, a single key scanner can be connected to a good number of key switches, much greater than those attainable in the prior art, while providing reliable and high-speed readings of key switch states. The invention far lessens the requirements for impedances of devices involved in the key matrix circuit, and in particular, pull-up or pull-down resistors may have substantially any large values.

BRIEF DESCRIPTION OF THE DRAWINGS

The above and other objects and characteristics of the present invention are to be better understood by one skilled in the art according to the description of preferred embodiments of the present invention with reference to the accompanying drawings, in which:

FIGS. 2A to 2J are time charts representing operations the first prior art arrangement;

FIGS. 14A to 14G are time charts representing an operation of the second embodiment of the present invention.

DETAILED DESCRIPTION OF THE PREFERRED EMBODIMENTS

A first embodiment of the present invention will be described hereinafter with reference to the accompanying drawings.

Figure 1:
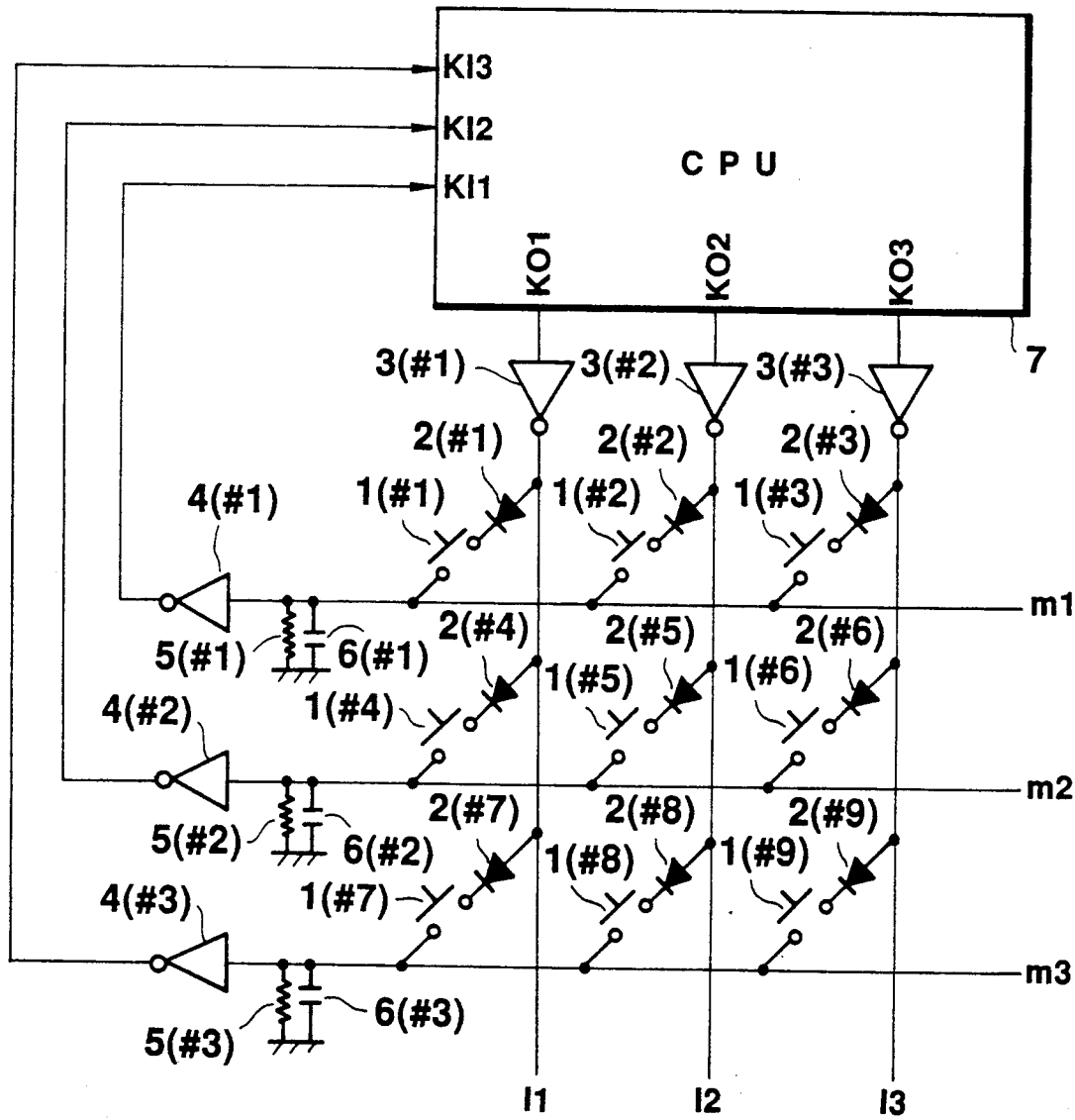
FIG. 1 shows a circuit diagram of a first prior art arrangement.
Figure 3A:
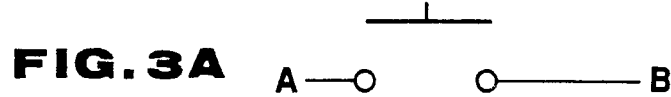
FIGS. 3A and 3B show equivalent circuits for a key switch.
Figure 3B:
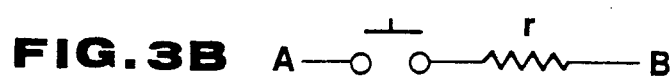
Figure 10:
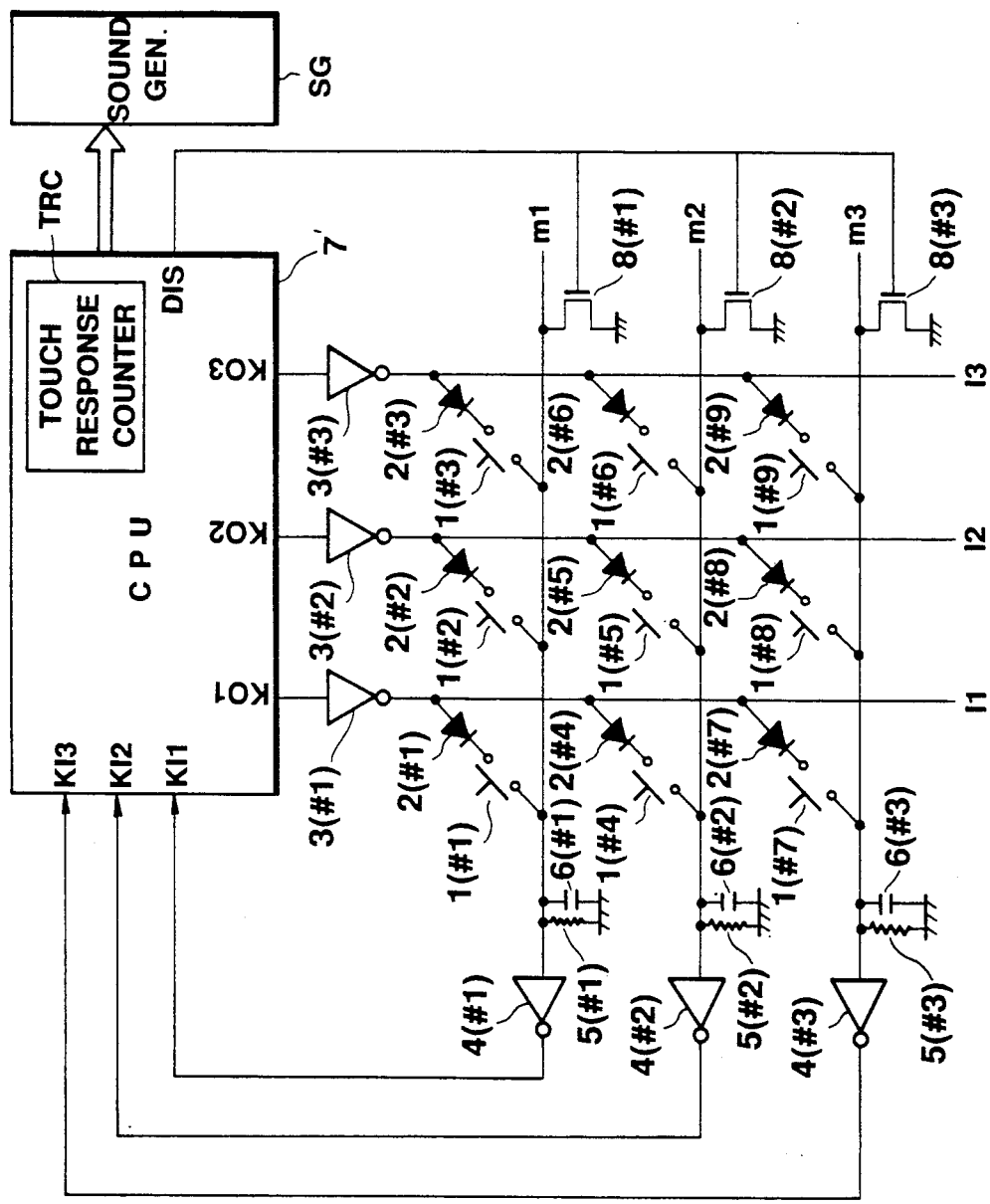
FIG. 10 is a circuit diagram of a first embodiment of the present invention.

FIG. 10 shows a circuit diagram of the first embodiment. A different portion thereof which is different from the first prior art arrangement shown in FIG. 1, is that input signal lines m1 to m3 are selectively connected to ground through respective MOSFET's (hereinafter, called simply FET's) 8(#1) to 8(#3).

CPU7' not only has the function of CPU7 described above with reference to FIG. 1, but also has an additional function of periodically outputting a control voltage signal from a terminal DIS (hereinafter, called a DIS output). The DIS output is commonly supplied to a gate terminal of respective FET's.

On the application of a high level signal from DIS, all FET's 8(#1) to 8(#3) are simultaneously switched into a conductive state. With a low level signal supplied from DIS, each of FET's 8(#1) to 8(#3) operates as a high impedance.

With DIS="HIGH", FET's quickly discharge capacitors 6(#1) to 6(#3) associated with the input signal lines m1 to m3 so that a low reference voltage level (ground potential) is immediately established on all input signal lines m1 to m3.

In FIG. 10, pull-down resistors 5(#1) to 5(#3) are drawn similarly to those of the first prior art shown in FIG. 1. However, their resistance $R_1$ of this first embodiment can be much larger than that of the first prior art. Since the FET's which conduct have a rapid pull-down function to set or pull down the input signal lines to a reference ground potential, the pull-down resistors 5(#1) to 5(#3) could even be deleted in some cases when the key switches are continuously scanned.

An operation of the first embodiment will be described hereinafter.

FIGS. 11A to 11G show time charts of an operation when only the key switch 1(#1) is actuated ON.

Figure 11:
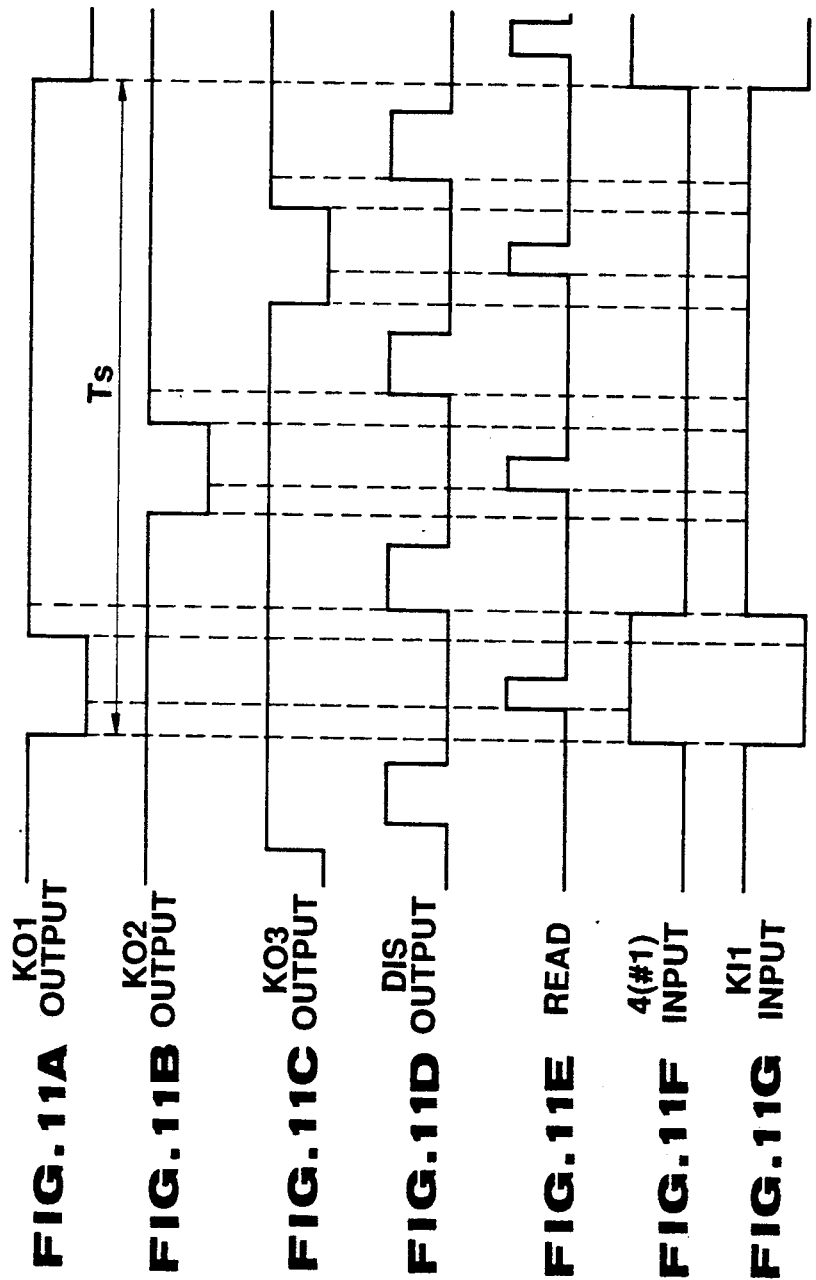
FIGS. 11A to 11G are time charts representing an operation of the first embodiment of the present invention.

CPU7' controls the output terminals KO1 to KO3 to provide a series of low level voltage pulses successively and cyclically as shown in FIGS. 11A to 11C in a similar manner to the above-mentioned first prior art arrangement.

As shown in FIG. 11D, CPU7' periodically sets the DIS output to a high level at times when outputs from terminals KO1 to KO3 are all at a high (passive) level between low (active) level periods of one and another of the output terminals. In these intervals, an electric charge stored in capacitors 6(#1) to 6(#3) associated with the input signal lines m1 to m3 is discharged rapidly through FET's 8(#1) to 8(#3) now controlled to be conductive by a high level control voltage from DIS terminal so that the input signal lines m1 to m3 will be set (pull-down) to a reference ground potential before the next low active period begins on one of the output terminals KO1 to kO3.

Figure 4:
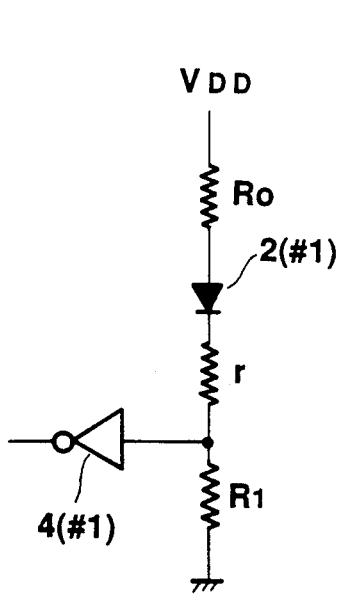
FIG. 4 shows a relationship of resistors when only one key switch is actuated ON in a key matrix using a positive logic.

Accordingly, CPU7' can correctly read input voltage signals on the input terminals KI1 to KI3 at READ pulse times shown in FIG. 11E, immediately after an output signal from KO1 to KO3 goes down to a low level. Therefore, one complete cycle time Ts for scanning all key switches 1(#1) to 1(#9) can be much shortened as compared with that of the first prior art arrangement shown in FIG. 2C. In the arrangement of FIG. 10, the respective resistance $R_1$ of pull-down resistors 5(#1) to 5(#3) does not influence the cycle time Ts. During a low voltage level period of KO1, there may be considered an equivalent circuit of on-operated key switch 1(#1) similar to that of FIG. 4 of the prior art because the FET 8 (#1) operates as a high impedance with a low level control signal from DIS terminal. Therefore, an input voltage to the inverter (receiver) 4(#1) follows the same equation (1) discussed above. In this embodiment, the resistance $R_1$ of resistors 5(#1) to 5(#3) can be selected as a large value, and $R_1 >> R_0 + r$ is established. Accordingly, from equation (1) with $R_1 >> R_0 + r$, the receiver input voltage is approximated to $V_{DD} - V_F$, sufficiently higher than the threshold voltage of the receiver. This definitely causes its output and thus a voltage on the pin KI1, to assume a low level indicative of the on-state of the key switch 1#(1).

In this manner, this embodiment provides a high speed detection of key operations and allows selection of any large value of the resistance $R_1$ of resistors 5(#1) to 5(#3).

Figure 5:
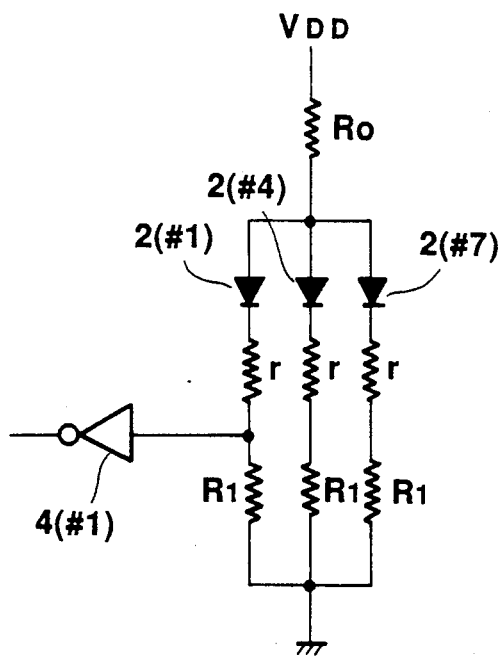
FIG. 5 shows a relationship of resistors when three key switches are actuated ON simultaneously in a key matrix using a positive logic.

In the case where all key switches 1(#1), 1(#4) and 1(#7) are simultaneously actuated ON, and when a low level voltage is supplied from the terminal KO1, the input voltage to the receiver inverter 4(#1) may be calculated from the above equation (2) in view of an equivalent circuit such as shown in FIG. 5. Using the relation of $R_1 >> 3R_0 + r$, the receiver input voltage is approximated again to $V_{DD} - V_F$ so that CPL 7' (key scanner) can correctly read simultaneous on-state of all key switches 1(#1), 1(#4) and 1(#7).

In this manner, the input voltage to the inverters (receivers) 4(#1) to 4(#3) are determined at a correct level independently of the number of the input signal lines or the number of simultaneous on-operated key switches. Accordingly, even if a number of input signal lines are much increased from three (i.e., m1 to m3), a reliable detection for key operations is assured. For n×n key switches, it can readily assigns the same number n to input and output signal lines for the key matrix so that the total number of the signal lines as well as the number of pins (terminals) of CPU on an LSI is minimized.

The first embodiment can advantageously be applied to a touch response electronic keyboard musical instrument which controls sound generator SG shown in FIG. 10 to generate a sound with a touch response effect. This feature will now be discussed with reference to FIGS. 12A to 12D.

In a touch response instrument, a pair of switches for a key depression speed detection are provided for each play key of a musical keyboard. One of such switch pairs may be represented by key switches 1(#1) and 1(#2) in FIG. 10.

Figure 12:
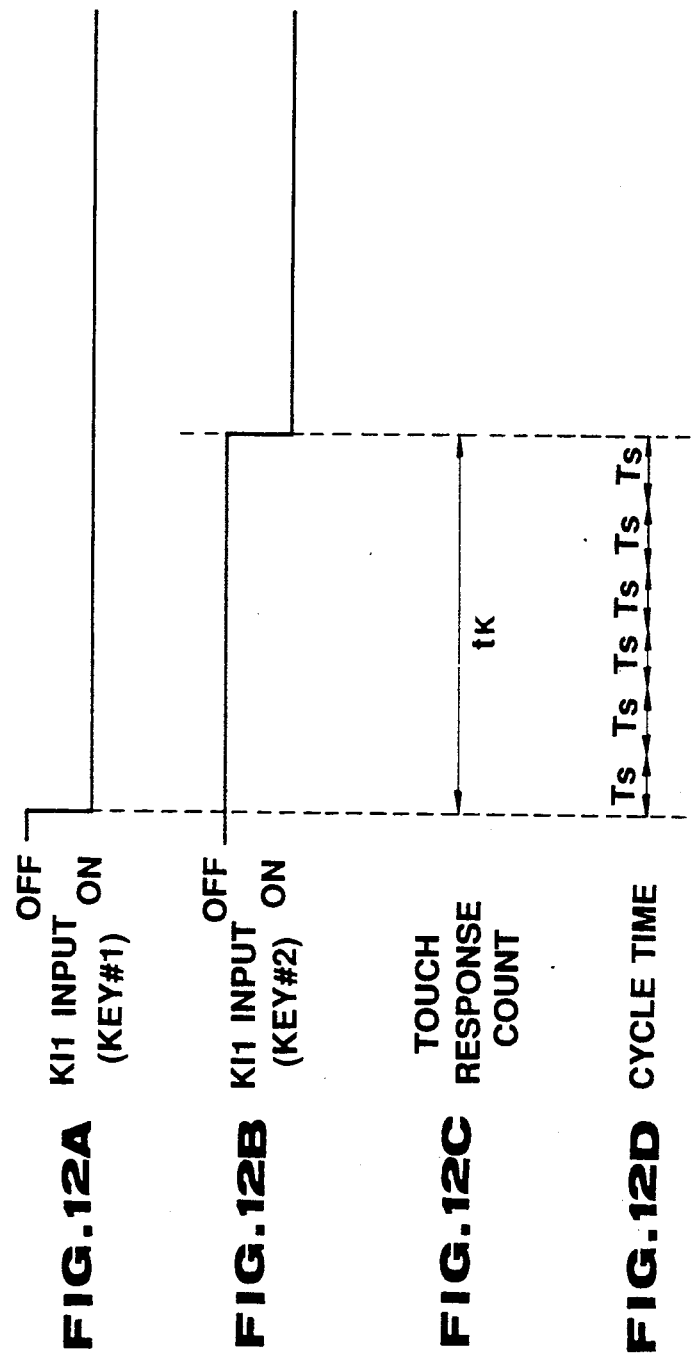
FIGS. 12A to 12D are time charts representing an operation for touch response control executed in the first embodiment of the present invention.

When the corresponding key is pushed down, the key switch 1(#1) is actuated ON first, and then the key switch 1(#2) is actuated ON as shown in FIGS. 12A and 12B. A time tk in FIG. 12C between ON-timings of both key switches 1(#1) and 1(#2) corresponds to the key depression speed. The time tk is measured by a touch response counter TRC internally provided in CPU 7'. Therefore, if the time tk is small, it means a hard (high speed) key touch, while if tk is large, a soft (low speed) touch is indicated.

As shown in FIG. 12D, the time tk is measured in terms of a multiple of key scanning cycle times Ts shown in FIG. 11A. For example, if both key switches 1(#1) and 1(#2) are detected to be on-operated within the same scanning cycle, $0 \times Ts = 0$ is established for the key velocity time tk, and therefore both key switches are recognized to be operated simultaneously. In another case, if an ON-operation of key switch 1 (#1) is detected at a scanning cycle and if an ON-operation of key switch 1(#2) is detected at the next scanning cycle, then the key velocity time tk is given by $1 \times Ts = Ts$. In this manner, the length of key scanning cycle Ts defines resolution of time tk indicative of key velocity.

Accordingly, if one scanning cycle time Ts is designed to be relatively long as mentioned in the prior art, the resolution becomes low resulting in a coarse and inaccurate touch response control such as adjustment and modulation of tone volume, timbre, and so on. In the prior art, for shortening the scanning cycle time Ts, there is no choice but to decrease a number of output signal lines to the key matrix circuit. This, in turn, increases a number of input signal lines from the key matrix circuit with a given number of key switches which can be a good number typically in the application of electronic keyboard instruments, and in particular in the case of touch response instruments. The increased number of input signal lines then causes erroneous readings of key switch states particularly in the event of simultaneous on-operations of a plurality of keys, while at the same time increasing the total number of signal lines for the key matrix circuit. Contrary to the prior art, the first embodiment allows a shortened scanning time Ts as discussed and, therefore, an electronic keyboard musical instrument having a good response capability can be realized in accordance with the present invention. The total number of signal lines are optimized assigning the same or similar numbers to the input and output signal lines, realizing a miniaturization of the key scanning apparatus.

A second embodiment of the present invention will be described hereinafter.

Figure 6:
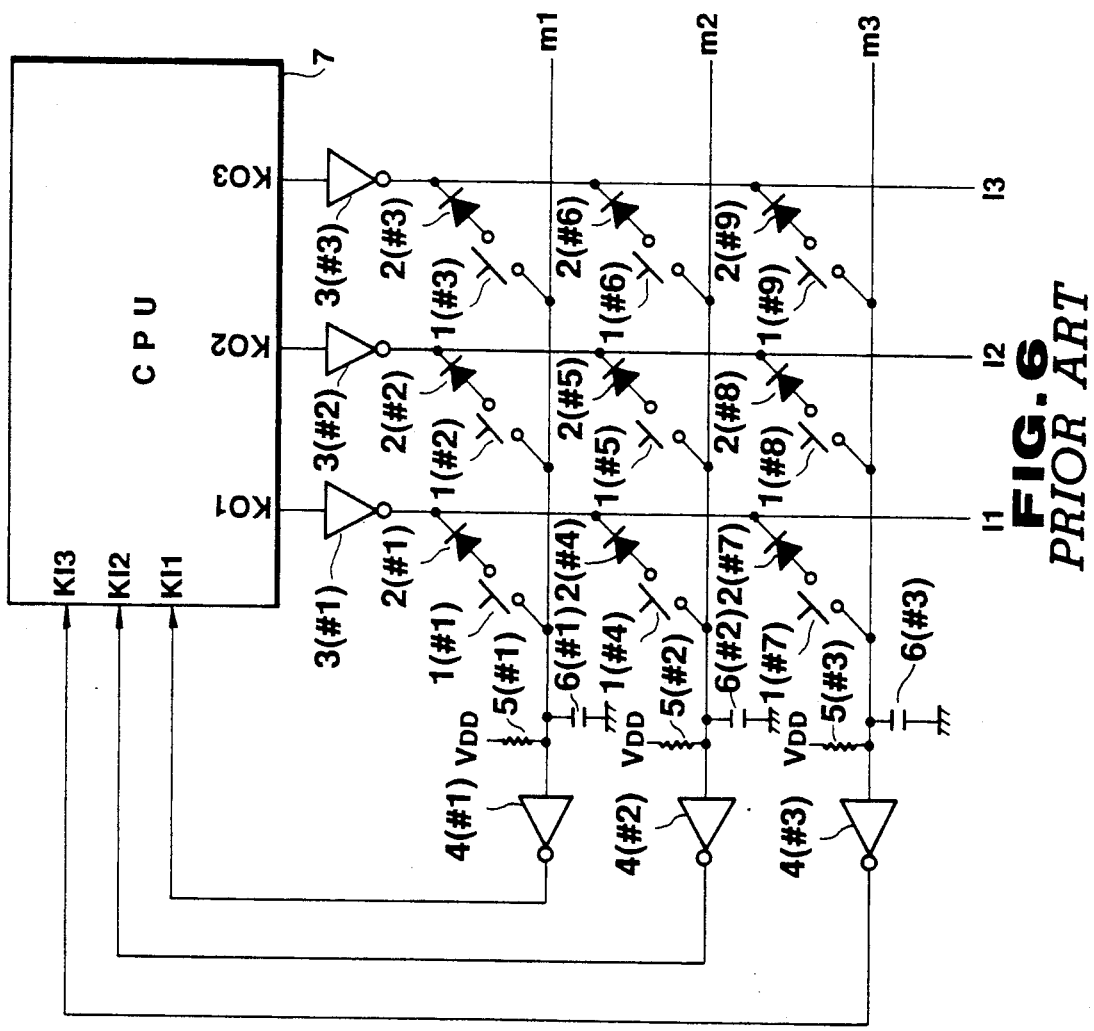
FIG. 6 shows a circuit diagram of a second prior art arrangement.
Figure 13:
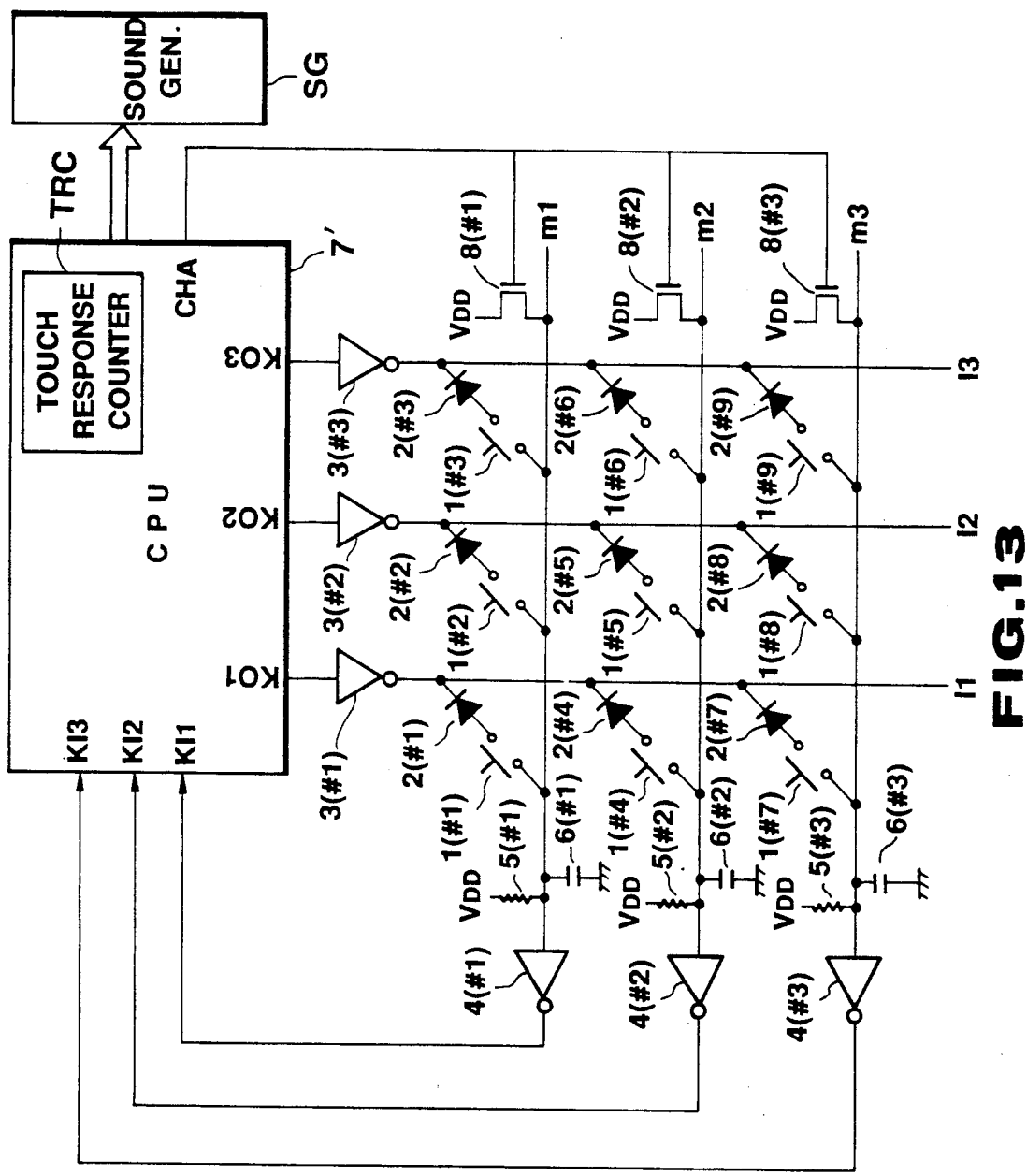
FIG. 13 is a circuit diagram of a second embodiment of the present invention.

FIG. 13 shows a circuit diagram of the second embodiment. The portion thereof which is different from the second prior art arrangement shown in FIG. 6 is that the input signal lines m1 to m3 are selectively connected to be charged through respective MOSFET's (hereinafter, called simply FET's) 8(#1) to 8(#3).

CPU 7' not only has the function of CPL 7 described with reference to FIG. 6, but also has an additional function for periodically outputting a line-charging control voltage signal from a terminal CHA (hereinafter, referred to as CHA output). The CHA output is commonly supplied to a gate terminal of respective FET's.

Accordingly, respective FET's 8(#1) to 8(#3) are simultaneously biased ON when the CHA output becomes high level. On the other hand, the FET's 8(#1) to 8(#3) operate as a high impedance when the CHA output becomes low level.

With CHA="HIGH", FET's conduct and quickly charge capacitors 6(#1) to 6(#3) associated with the input signal lines m1 to m3 to set (pull-up) these lines to a high reference potential (voltage level of $V_{DD}$).

In FIG. 13, pull-up resistors 5(#1) to 5(#3) are drawn similarly to the second prior art arrangement shown in FIG. 6. However, their resistance $R_1$ of this second, embodiment can be much larger than that of the second prior art arrangement. These resistors 5(#1) to 5(#3) might even be deleted in some cases in the presence of FET's having an immediate potential establishing (pull-up) function.

An operation of this second embodiment will be described hereinafter.

FIGS. 14A to 14G show time charts of an operation when only the key switch 1(#1) is actuated ON.

CPL 7' controls the output terminal KO1 and KO3 to provide a series of high level voltage pulses successively and cyclically as shown in FIGS. 14A to 14C, similarly to the above-mentioned second prior art arrangement.

As shown in FIG. 14D, CPL 7' periodically sets the CHA output to a high level when outputs from terminals KO1 to KO3 are all low level between high (active) level periods thereof. In these intervals, FET's 8(#1) to 8(#3) are controlled to conduct so as to rapidly charge the capacitors 6(#1) to 6(#3) associated with the input signal lines m1 to m3 so that a reference potential of $V_{DD}$ is established on these input signal lines m1 to m3 prior to the next high active period of output terminals KO1 to KO3.

Figure 7:
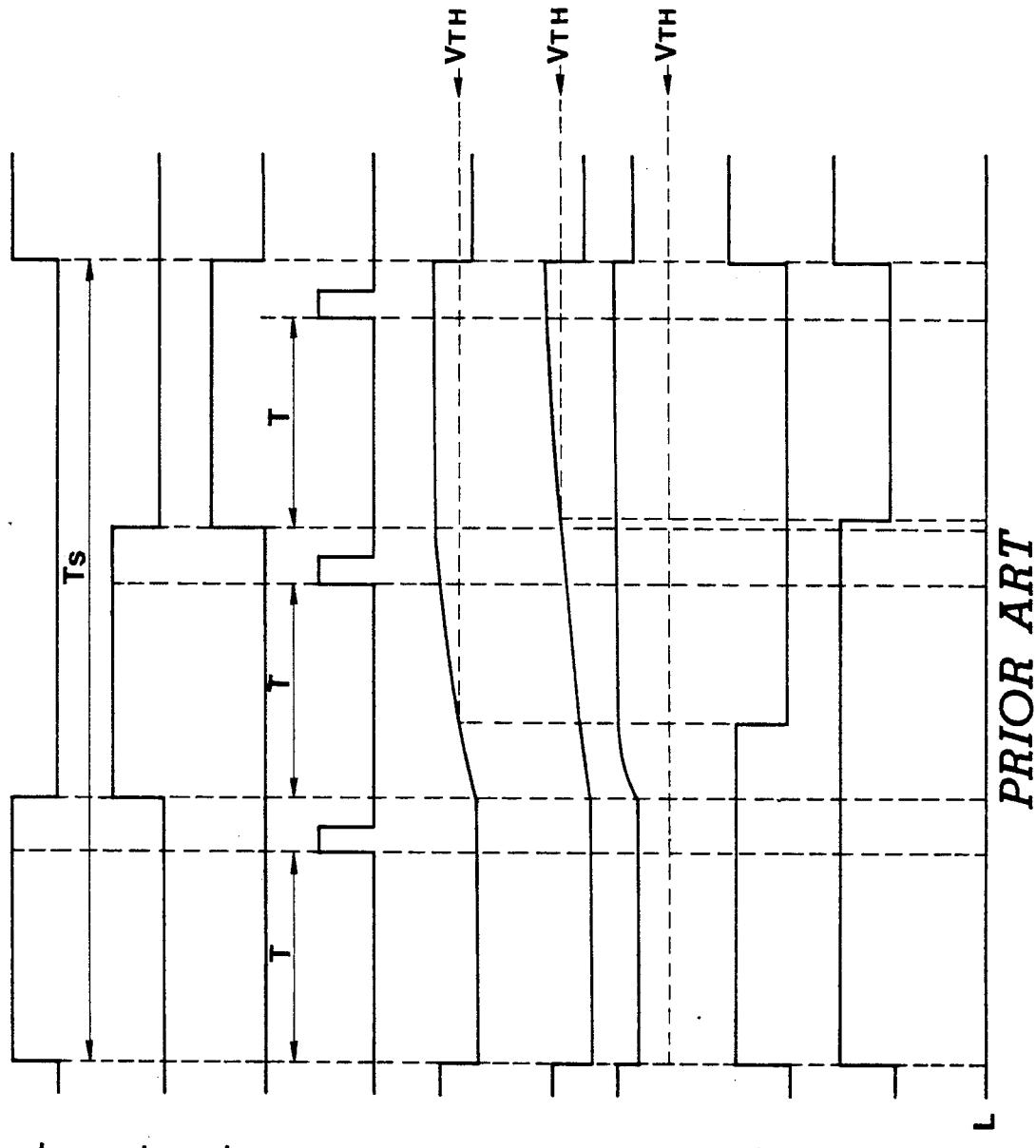
FIGS. 7A to 7J are time charts representing operations of the second prior art arrangement.
Figure 8:
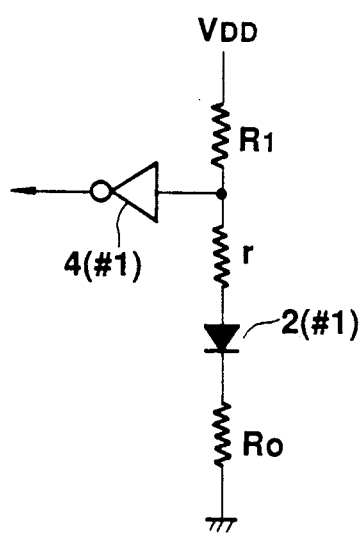
FIG. 8 shows a relationship of resistors when only a key switch is actuated ON in a key matrix using a negative logic.

Accordingly, CPU 7' can correctly read input voltage signals on terminals KI1 to KI3 at READ pulse times in FIG. 14E immediately after an output voltage from KO1 to KO3 goes to a high level. Therefore, one complete cycle Ts for scanning all key switches can be far shorter as compared with that of the second prior art arrangement shown in FIG. 7C. In this arrangement of FIG. 13, the resistance $R_1$ of pull-up resistors 5(#1) to 5(#3) does not influence the cycle time Ts. During a high active level period of KO1, there is formed an equivalent circuit similar to that of FIG. 8 already stated, because FET8 (#1) operates as a high impedance with a low level control voltage from CHA terminal. Therefore, an input voltage to the inverter (receiver) 4(#1) essentially follows the equation (3) discussed earlier. In this second embodiment, however, the resistance $R_1$ of resistors 5(#1) to 5(#3) can be selected as a large value, and $R_1 >> R_0 + r$ is established. Thus, the resultant input voltage is approximately $V_F$. With this small input voltage of $V_F$, the inverter (receiver) 4#1() definitely produces a high level voltage on CPU terminal KI1 to provide a correct indication of an on-state of the key switch 1(#1).

In this manner, the second embodiment provides a shortened detection time for key operations and allows selection of any large value of resistance $R_1$ of resistors 5(#1) to 5(#3).

Figure 9:
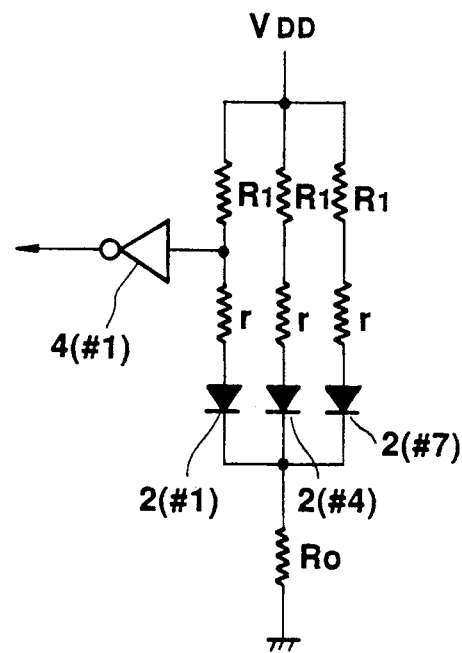
FIG. 9 shows a relationship of resistors when three key switches are actuated ON simultaneously in a key matrix using a negative logic.

In the case where all key switches 1(#1), 1(#4) and 1(#7) are simultaneously operated, a voltage which appears the inverter (receiver) 4(#1) input during a high period of KO1 may be calculated from the above equation (4) in view of an equivalent circuit such as shown in FIG. 9. Using the resistive relation of $R_1 >> 3R_0 + r$, the receiver input voltage approximates again to $V_F$, which allows CPL 7' to correctly read a simultaneous on-state of all key switches 1(#1), 1(#4) and 1(#7).

In the above described manner, the second embodiment can assure reliable detection of key switch operations, regardless of the number of input signal lines and key switches by using a large resistance value $R_1$ of the pull-up resistors such as resistors 5(#1) to 5(#3). The total number of the signal lines involved in the key matrix circuit can always be optimized thereby to realize a miniaturization of the key scanner including CPU 7' which may be fabricated on an LSI chip.

A touch response electronic keyboard musical instrument based on the above-mentioned second embodiment, is also disclosed in FIG. 13 and produces essentially the same results as those based on the first embodiment.

The present invention may be practiced or embodied in still other ways without departing from the spirit or essential characteristics thereof. For example, the present invention can be practiced or embodied as various types of electronic equipment such as an electronic calculator, an electronic word processor, an electronic typewriter, a computer and the like.

The preferred embodiments described herein are therefor illustrative and not restrictive, the scope of invention is indicated by the appended claims and all variations which come within the meaning of the claims are intended to be embraced therein.

I claim:

1. A switch operation detection apparatus, comprising:
    a plurality of switch means arranged in a switch matrix at intersections of a plurality of input signal lines and a plurality of output signal lines, each for selectively connecting a corresponding output signal line to a corresponding input signal line electronically;
    scanning means for cyclically scanning the switch matrix (i) by supplying voltage pulses to the plurality of output signal lines such that one voltage pulse from said voltage pulses is supplied to each of the plurality of output signal lines once in each of a plurality of cycles, with each of said cycles including a series of said voltage pulses and (ii) by detecting voltage levels derived from the plurality of input signal lines in order to detect, in each of said cycles, the respective ON/OFF status of the plurality of switch means; and
    discharging means for rapidly discharging in each of said cycles the plurality of input signal lines at predetermined times between each set of adjacent voltage pulses of said series of voltage pulses from said scanning means.

2. The apparatus according to claim 1, wherein said discharging means includes:
    a plurality of MOS FET's each provided for a different one of the plurality of input signal lines, for selectively connecting the plurality of input signal lines to a ground; and
    control means for controlling said plurality of MOS FET's to be ON-operated at said predetermined times by applying a control voltage to a gate terminal of the MOS FET's in order to connect the input signal lines to the ground.

3. The apparatus according to claim 1, wherein said plurality of switch means include switches provided for respective keys of an electronic keyboard musical instrument for detecting a key depression speed.

4. The apparatus according to claim 2, wherein said plurality of switch means include switches provided for respective keys of an electronic keyboard musical instrument for detecting a key depression speed.

5. A switch operation detection apparatus, comprising:
    a plurality of switch means arranged in a switch matrix at intersections of a plurality of input signal lines and a plurality of output signal lines, each for selectively connecting a corresponding output signal line to a corresponding input signal line electronically;
    scanning means for cyclically scanning the switch matrix (i) by supplying voltage pulses to the plurality of output signal lines such that one voltage pulse from said voltage pulses is supplied to each of the plurality of output signal lines once in each of a plurality of cycles, with each of said cycles including a series of said voltage pulses, and (ii) by detecting voltage levels derived from the plurality of input signal lines in order to detect, in each of said cycles, the respective ON/OFF status of the plurality of switch means; and
    charging means for rapidly charging, in each of said cycles, the plurality of input signal lines at predetermined times between each set of adjacent voltage pulses of said series of voltage pulses from said scanning means.

6. The apparatus according to claim 5, wherein said charging means includes:
    a plurality of MOS FET's each provided for a different one of the plurality of input signal lines, for selectively supplying a predetermined voltage to the plurality of input signal lines; and
    control means for controlling said plurality of MOS FET's to be ON-operated at said predetermined times by applying a control voltage to a gate terminal of the MOS FET's in order to supply said predetermined voltage to said plurality of input signal lines.

7. The apparatus according to claim 5, wherein said plurality of switch means include switches provided for respective keys of an electronic keyboard musical instrument for detecting a key depression speed.

8. The apparatus according to claim 6, wherein said plurality of switch means include switches provided for respective keys of an electronic keyboard musical instrument for detecting a key depression speed.

9. An electronic musical instrument, comprising:
    a keyboard having a plurality of keys;
    a plurality of switch means associated with said keys and arranged in a switch matrix at intersections of a switch matrix arranged by a plurality of input signal lines and a plurality of output signal lines, each for selectively connecting a corresponding output signal line to a corresponding input signal line electronically;
    scanning means for cyclically scanning the switch matrix (i) by supplying voltage pulses to the plurality of output signal lines such that one voltage pulse from said voltage pulses is supplied to each of the plurality of output signal lines once in each of a plurality of cycles, with each of said cycles including a series of said voltage pulses, and (ii) by detecting voltage levels derived from the plurality of input signal lines in order to detect, in each of said cycles, the respective ON/OFF status of the plurality of switch means;
    discharging means for rapidly discharging, in each of said cycles, the plurality of input signal lines at predetermined times between each set of adjacent voltage pulses of said series of voltage pulses from said scanning means; and
    sound generating means coupled to said scanning means for generating a musical sound signal having a pitch designated by a switch means, an ON-operation of which is detected by said scanning means.

10. The electronic musical instrument according to claim 9, wherein said plurality of switch means include pairs of switches each pair of which is associated with a different one of the keys and operates with a time difference, and said scanning means includes means for detecting a key depression speed by measuring a time difference of operations of a pair of key switch means for controlling the sound generating means to generate a musical sound signal modulated by said key depression speed detected.

11. The electronic musical instrument according to claim 9, wherein said discharging means includes:
   a plurality of MOS FET's each provided for a different one of the plurality of input signal lines, for selectively connecting the plurality of input signal lines to a ground; and
   control means for controlling said plurality of MOS FET's to be ON-operated at said predetermined times by applying a control voltage to a gate terminal of the MOS FET's in order to connect the input signal lines to the ground.

12. The electronic musical instrument according to claim 9, wherein said discharging means includes;
   a plurality of gating means each provided for a different one of the plurality of input signal lines, for selectively connecting the plurality of input signal lines to a ground; and
   control means for controlling said plurality of gating means to be ON-operated at said predetermined times in order to connect the input signal lines to the ground.

13. An electronic musical instrument, comprising:
   a keyboard having a plurality of keys;
   a plurality of switch means at least partially associated with said keys arranged in a switch matrix at intersections of a plurality of input signal lines and a plurality of output signal lines, each for selectively connecting a corresponding output signal line to a corresponding input signal line electronically;
   scanning means for cyclically scanning the switch matrix (i) by supplying voltage pulses to the plurality of output signal lines such that one voltage pulse from said voltage pulses is supplied to each of the plurality of output signal lines once in each of a plurality of cycles, with each of said cycles including a series of said voltage pulses, and (ii) by detecting voltage levels derived from the plurality of input signal lines in order to detect, in each of said cycles, the respective ON/OFF status of the plurality of switch means;
   charging means for rapidly charging, in each of said cycles, the plurality of input signal lines at predetermined times between each set of adjacent voltage pulses of said series of voltage pulses form said scanning means; and
   sound generating means coupled to said scanning means for generating a musical sound signal having a pitch designated by a switch means, an ON-operation of which is detected by said scanning means.

14. The electronic musical instrument according to claim 13, wherein said plurality of switch means include paris of switches, each pair of which is associated with a different one of the keys and operates with a time difference, and said scanning means includes means for detecting a key depression speed by measuring a time difference of operations of a pair of key switches and means for controlling the sound generating means to generate a musical sound signal modulated by said key depression speed detected.

15. The electronic musical instrument according to claim 13, wherein said charging means includes:
   a plurality of MOS FET's each provided for a different one of the plurality of input signal lines, for selectively supplying a predetermined voltage to the plurality of input signal lines; and
   control means for controlling said plurality of MOS FET's to be ON-operated at said predetermined times by applying a control voltage to a gate terminal of the MOS FET's in order to supply said predetermined voltage to said plurality of input signal lines.

16. The electronic musical instrument according to claim 13, wherein said charging means includes:
   a plurality of gating means each provided for a different one of the plurality of input signal lines, for selectively supplying a predetermined voltage to the plurality of input signal lines; and
   control means for controlling said plurality of gating means to be ON-operated at said predetermined times in order to supply said predetermined voltage to said plurality of input signal lines.

17. A switch operation detection apparatus comprising:
   a plurality of switch means arranged in a switch matrix at intersections of a plurality of input signal lines and a plurality of output signal lines, each for selectively coupling one of said plurality of output signal lines to one of said plurality of input signal lines;
   scanning means for cyclically scanning said switch matrix (i) by supplying voltage pulses to said plurality of output signal lines such that one voltage pulse from said voltage pulses is supplied to each of the output signal lines once in each of a plurality of cycles, with each of said cycles including a series of said voltage pulses, and (ii) by detecting voltage levels derived from said plurality of input signal lines in order to detect, in each of said cycles, the respective ON/OFF status of said plurality of switch means;
   reference establishing means for rapidly establishing a reference potential on said plurality of input signal lines at predetermined times during a cycle of said scanning means; and
   means for comparing said detected voltage levels with said reference potential in each of said cycles.

* * * * *

UNITED STATES PATENT AND TRADEMARK OFFICE
CERTIFICATE OF CORRECTION

PATENT NO. : 5,151,554
DATED : September 29, 1992
INVENTOR(S) : MATSUDA, Takashi It is certified that error appears in the above-identified patent and that said Letters Patent is hereby corrected as shown below:

Column 15, line 50 (claim 13):

Change the word "form" to --from--.

Signed and Sealed this

Seventeenth Day of December, 1996

Attest:

BRUCE LEHMAN

Attesting Officer        Commissioner of Patents and Trademarks